(12) United States Patent
Zheng

(10) Patent No.: US 8,927,350 B2
(45) Date of Patent: Jan. 6, 2015

(54) INTEGRATION FLOW FOR LDD AND SPACER FABRICATION ON A SACRIFICIAL AMORPHOUS CARBON GATE STRUCTURE

(71) Applicant: Chunsheng Zheng, Shanghai (CN)

(72) Inventor: Chunsheng Zheng, Shanghai (CN)

(73) Assignee: Shanghai Huali Microelectronics Corporation (CN)

( * ) Notice: Subject to any disclaimer, the term of this patent is extended or adjusted under 35 U.S.C. 154(b) by 71 days.

(21) Appl. No.: 13/716,990

(22) Filed: Dec. 17, 2012

(65) Prior Publication Data

US 2013/0273702 A1  Oct. 17, 2013

(30) Foreign Application Priority Data

Apr. 16, 2012  (CN) .......................... 2012 1 0109582

(51) Int. Cl.
*H01L 21/00* (2006.01)
*H01L 21/8238* (2006.01)

(52) U.S. Cl.
CPC ..... *H01L 21/823814* (2013.01); *H01L 21/823828* (2013.01); *H01L 21/823864* (2013.01)
USPC ............................. 438/151; 438/163; 438/230

(58) Field of Classification Search
CPC .................... H01L 21/823814; H01L 29/789; H01L 29/66598
USPC ......... 438/199, 238, 151, 163, 230; 257/410, 257/E21.409, E21.004, 336, E51.006, 257/E21.626
See application file for complete search history.

(56) References Cited

U.S. PATENT DOCUMENTS

| | | | |
|---|---|---|---|
| 2011/0260220 A1* | 10/2011 | Chi et al. ....................... | 257/288 |
| 2011/0266637 A1* | 11/2011 | Lee et al. ....................... | 257/410 |
| 2012/0056245 A1* | 3/2012 | Kang et al. .................... | 257/192 |
| 2013/0102125 A1* | 4/2013 | Venigalla et al. ............. | 438/437 |
| 2013/0234216 A1* | 9/2013 | Chou et al. ..................... | 257/288 |
| 2013/0279259 A1* | 10/2013 | Forbes et al. ............ | 365/185.18 |
| 2013/0292775 A1* | 11/2013 | Hwang et al. ................. | 257/368 |

FOREIGN PATENT DOCUMENTS

CN            101593686 A    12/2009

* cited by examiner

*Primary Examiner* — Jarrett Stark
*Assistant Examiner* — Shahed Ahmed
(74) *Attorney, Agent, or Firm* — St. Onge Steward Johnston & Reens LLC

(57) ABSTRACT

An integration flow for LDD and spacer fabrication on a sacrificial amorphous carbon gate structure, form first spacer by way of depositing on the si substrate which have gate structure first. Gate is provided above the N-well and P-well on substrate. Spin coating a layer of photoresist in the first spacer, patterning the photoresist, and the gate structure above the N-well or P-well is exposed, ion lightly dope treatment is then used to the whole device. Remove the redundant photoresist and the first spacer layer, form the second spacer layer by depositing on the surface of the si substrate and gate, and spin coating another photoresist layer on the second spacer layer. Pattern the another photoresist layer, and another side of the gate structure is exposed, ion lightly dope treatment is then used to the whole device. Remove the redundant photoresist and the second spacer layer, form the third spacer layer and SiN layer by depositing on the gate and the Si substrate in turn. Form spacer by removing the redundant the third spacer layer and SiN layer.

5 Claims, 4 Drawing Sheets

INTEGRATION FLOW FOR LDD AND SPACER FABRICATION ON A SACRIFICIAL AMORPHOUS CARBON GATE STRUCTURE

FIELD OF THE INVENTION

The present invention is directed to a technology of manufacturing of CMOS semiconductor device, especially an integration flow for LDD and spacer fabrication on a sacrificial amorphous carbon gate structure.

BACKGROUND OF THE INVENTION

China patent No. CN101593686A disclosed an integration flow for fabricating the metal gate. It select amorphous carbon as the sacrificial gate material and form the substrate structure which is needed by the Gate-last craft. It comprise the specific process flow of forming gate dielectric layer on substrate; forming patterning amorphous carbon layer on said gate dielectric layer; spacer around said patterning amorphous carbon layer; forming inter-layer dielectric which cover said spacer around patterning amorphous carbon layer; planarizing said inter-layer dielectric and exposing said patterning amorphous carbon layer; using oxygen ashing process to remove said patterning amorphous carbon layer; forming trench in said inter-layer dielectric; forming metal layer which fill said trench and cover said inter-layer dielectric.

The process provided by the patent mentioned above is very simple, so detailing is needed to quite a few process of the method. For example, the laminated structure before the gate is shaped up; the process before the sacrificial gate is shaped up; the process after the sacrificial gate is shaped up; the formation process of conventional spacer structure; the preparatory work of substrate for ion implant process; treatment process of Stress Proximity Technology (SPT); treatment process of Contact etch stop layer; treatment process before the Chemical Mechanical Polishing, etc.

SUMMARY OF THE INVENTION

According to the problems of the metal gate integration treatment process in the China patent No. CN101593686A, the present invention provides further refinement process. In order to achieve the object mentioned above, the present invention provides a method for manufacturing LDD and spacer for a semiconductor device with a sacrificial amorphous carbon gate structure, the method comprises:

Step 1) Form a first spacer layer by depositing on a substrate with gate, gate is provided above the N-well and P-well on said substrate, and said gate is a material appearing in amorphous carbon form;

Step 2) A first photoresist layer is spin coated on the first spacer layer, and a process of patterning is made to the first photoresist, selectively removing the portions of first photoresist that covered on the N-well but wherein a portion of first photoresist remains on P-well; then ion implantation is carried out to form LDD regions in a top portion of N-well;

Step 3) The redundant first photoresist is completely removed by a ashing process and the first spacer layer is also removed, a second spacer layer is deposited on the surface of substrate and gate, a second photoresist layer is spin coated on the second spacer layer;

Step 4) Patterning the second photoresist, selectively removing the portions of second photoresist that covered on the P-well but wherein a portion of second photoresist remains on N-well, then ion implantation is carried out to form LDD regions in a top portion of P-well;

Step 5) The redundant second photoresist is completely removed by a ashing process and the second spacer layer is removed, after that, forming a third spacer layer and a SiN layer on the substrate and the gate in turn, form a pre-determined spacer structure on sidewalls of gate by selectively etching the third spacer layer and SiN layer.

In a preferred embodiment provided by the present invention, said gate oxide layer is provided between said gate and Si substrate.

In a preferred embodiment provided by the present invention, the material of said first spacer layer can be selected from the group comprising: Oxide, silicon oxynitride, or silicon nitride.

In a preferred embodiment provided by the present invention, said first spacer layer and the second spacer layer is removed by wet etch process.

In a preferred embodiment provided by the present invention, selectively etching portions of the third spacer layer and SiN layer to form said spacer structure through dry etch process.

The fabrication provided by the present invention detailing and concretize the craft of LDD and spacer in the china patent NO.

DETAILED DESCRIPTION OF THE INVENTION

The present invention disclosed a semiconductor device with a sacrificial amorphous carbon gate structure and fabricating method thereof, form first spacer by means of depositing on the substrate which have gate structure first. Gate is provided above the N-well and P-well on substrate. Spin coating a layer of photoresist in the first spacer, patterning the photoresist, and the gate structure above the N-well or P-well is exposed, ion lightly dope treatment is then used to the whole device. Remove the redundant photoresist and the first spacer layer, form the second spacer layer by depositing on the surface of the Si substrate and gate, and spin coating another photoresist layer on the second spacer layer. Pattern the another photoresist layer, and another side of the gate structure is exposed, ion lightly dope treatment is then used to the whole device. Remove the redundant photoresist and the second spacer layer, form the third spacer layer and SiN layer by depositing on the gate and the Si substrate in turn. Form spacer by removing the redundant the third spacer layer and SiN layer.

Further detailed description of the present invention, an integration flow for LDD and spacer fabrication on a sacrificial amorphous carbon gate structure, is made by the following embodiments to have a better understanding of the invention. But the embodiments do not limit the scope of the protection of the present invention.

Figure 1:
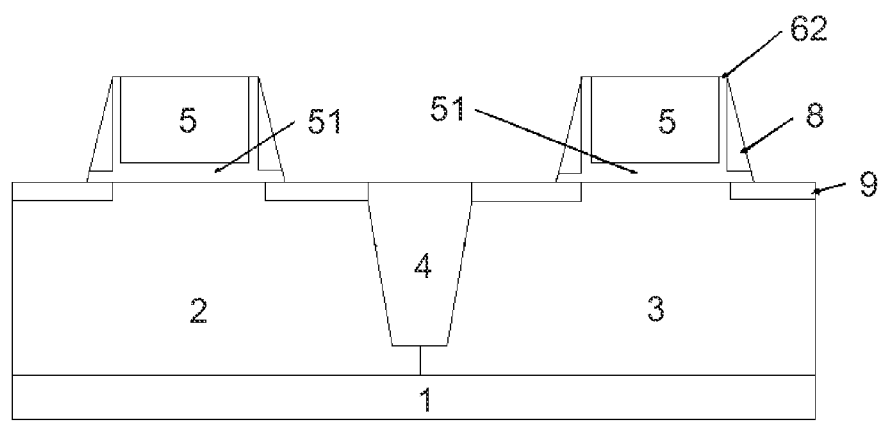
FIG. 1 is the sacrificial amorphous carbon gate structure with LDD and spacer obtained by one embodiment of the disclosure.

Provide Si substrate 1 with two or more gates structure as FIG. 1, in an exemplary embodiment, the gate 5 is a material appearing in amorphous carbon form (but not limit), a gate oxide layer is provided between the gate 5 and Si substrate 1, gates 5 is set over the N-well and P-well in the Si substrate 1, respectively.

Figure 2:
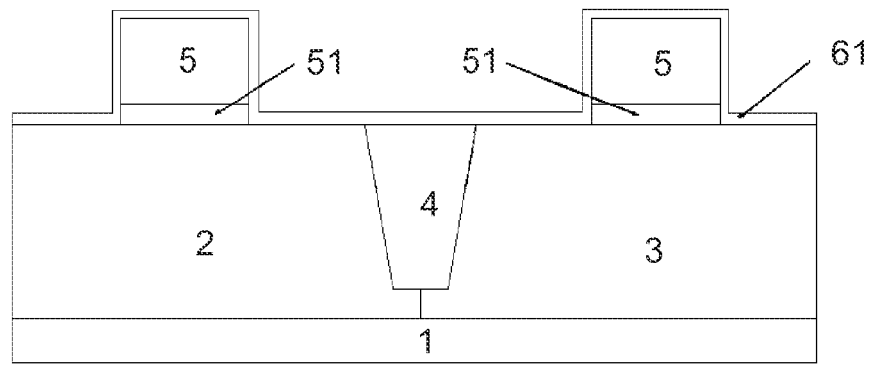
FIG. 2 is the structural representation of the device after the first spacer layer is deposited according to one embodiment of the disclosure.

FIG. 2, form the first spacer layer 61 by depositing on the Si substrate 1 and gate 5, and then begin LDD ion implantation process directly. As the portion of the spacer layer 61 at the top of the gate 5 needs to be reserved, so the conventional standard spacer etching step is omitted in the present invention, and the LDD ion implantation process is performed directly without spacer etching process. In a preferred embodiment the material of the first spacer layer 61 can be selected from the group comprising: Oxide, silicon oxynitride, or silicon nitride or other optional materials.

Figure 3:
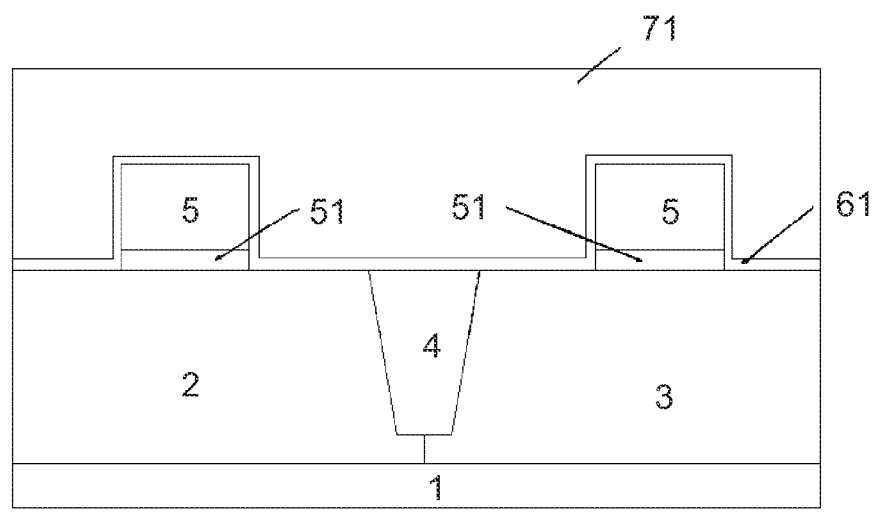
FIG. 3 is the structural representation of the device after spin coating the photoresist for the first time according to one embodiment of the disclosure.
Figure 4:
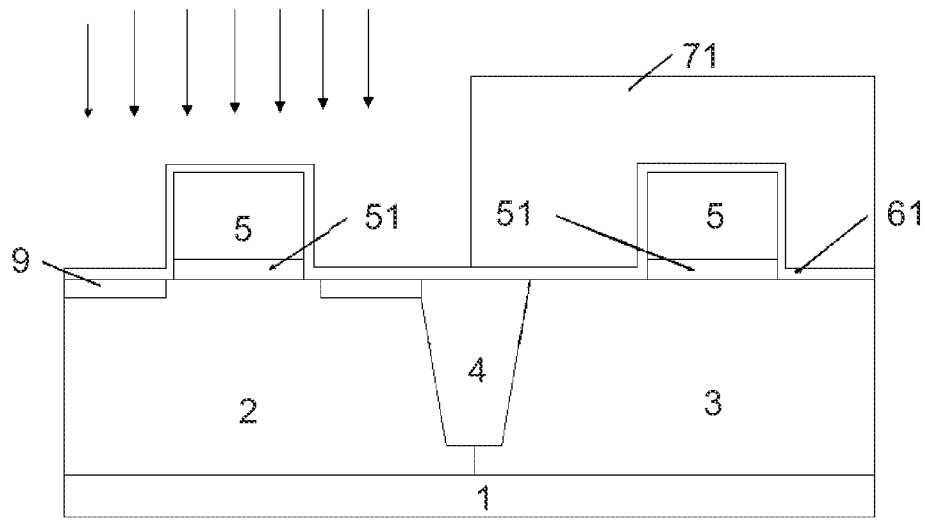
FIG. 4 is the structural representation of the device when doing P-type ion lightly dope treatment according to one embodiment of the disclosure.
Figure 5:
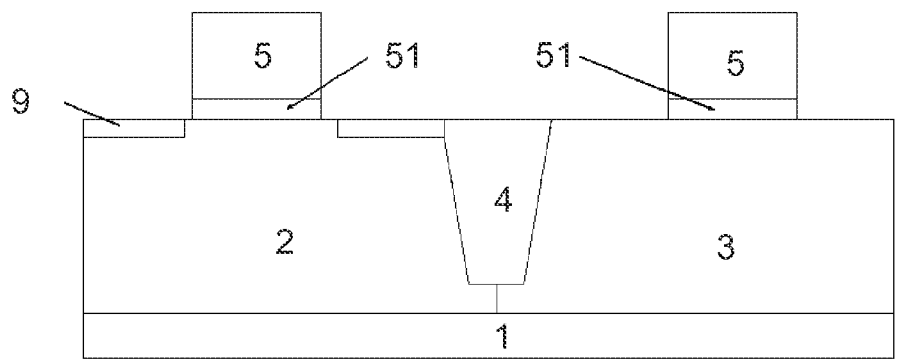
FIG. 5 is the structural representation according to one embodiment of the disclosure after removing the photoresist and the first spacer layer.
Figure 6:
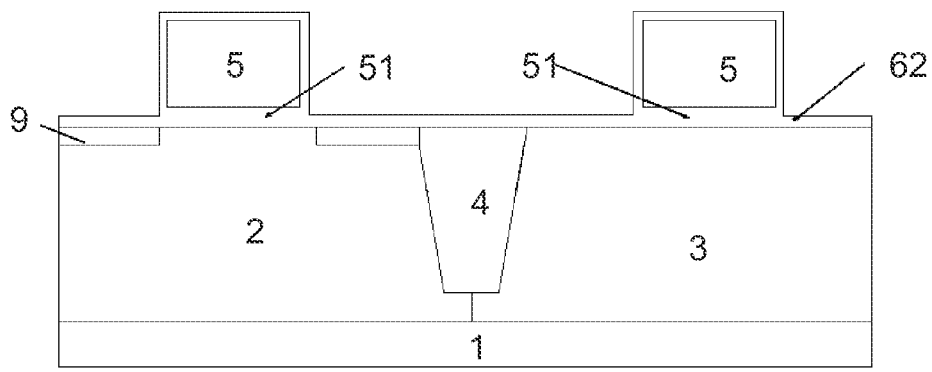
FIG. 6 is the structural representation of the device after the second spacer layer is deposited according to one embodiment of the disclosure.
Figure 7:
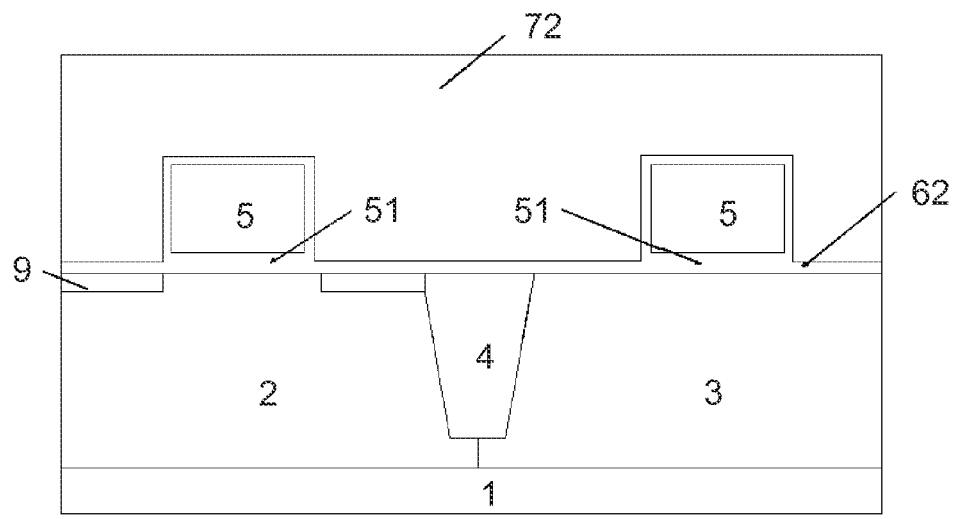
FIG. 7 is the structural representation of the device after spin coating the photoresist for the second time according to one embodiment of the disclosure.
Figure 8:
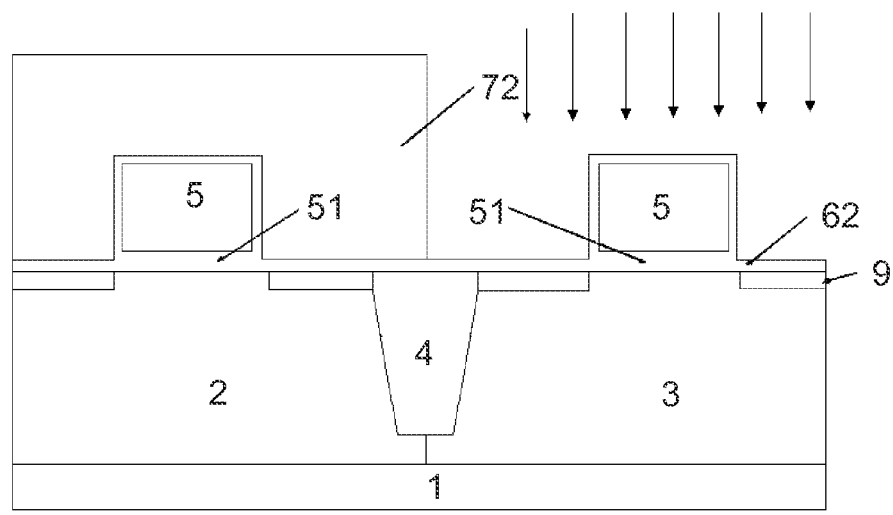
FIG. 8 is the structural representation of the device when doing N-type ion lightly dope treatment according to one embodiment of the disclosure.

FIG. 3 and FIG. 4, a photoresist layer 71 is spin coated over the first spacer layer, and a exposure and develop process is made to the photoresist 71 such as normal lithographic technology, so the gate 5 structure above the N-well 2 is exposed, and P-type ion lightly dope treatment is performed to form the Lightly doped drain/source region 9 in a top portion of N-Well 2. The type of the ion in the lightly dope treatment is related with the dopant type of the well below the gate structure exposed, for example, N-type ion lightly dope is needed when the well below the gate structure exposed is P-well.

FIG. 5 to FIG. 8, the redundant photoresist 71 is removed by ashing process and the first spacer layer 61 is removed by wet etch process. A second spacer layer 62 is deposited on the surface of Si substrate 1 and the gate 5, and a photoresist layer 72 is spin coated on the second spacer layer 62. a exposure and develop process is performed to pattern the photoresist 72 such as in a photolithography step, and the gate 5 structure above the P-well 3 is exposed. N-type ion lightly dope treatment is then performed to form the Lightly doped drain/source region 9 in a top portion of P-Well 3. In other words, the LDD regions in N-well are implanted using P-type doping material, the LDD regions in P-well are implanted using N-type doping material.

Figure 9:
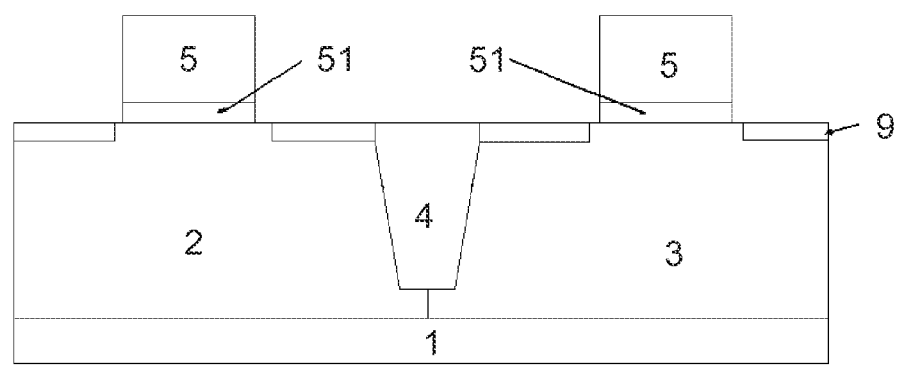
FIG. 9 is the structural representation according to one embodiment of the disclosure after removing the photoresist and the second spacer layer.
Figure 10:
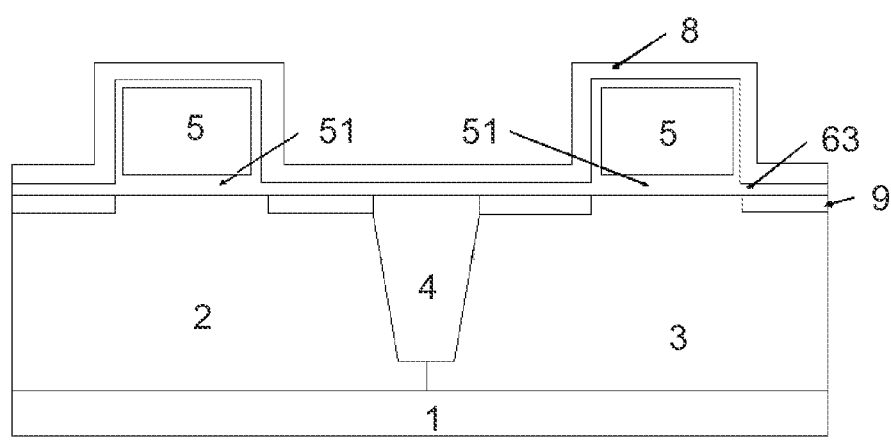
FIG. 10 is the structural representation according to one embodiment of the disclosure after the third spacer layer and the SiN layer are deposited.

FIG. 9 and FIG. 10, the redundant photoresist 72 is removed by ashing process and the second spacer layer 62 is removed by wet etch process, the undesirable polymer is also removed in wet etching process. Take the fabricating method mentioned above to form integrated LDD 9 in N-well 2 and P-well 3 (including NLDD in P-well 3 and PLDD in N-well). After that, form the third spacer layer 63 and SiN layer 8 by depositing on the surface of the Si substrate 1 and the gate 5 in turn. And then etch back (eg. dry etch) the third spacer layer 63 and SiN layer 8 to remove the portion of third spacer layer 63 and SiN layer 8 at the top of the gate 5, also remove the portion of third spacer layer 63 and SiN layer 8 covered at the top surface of the substrate 1, only reserve the portion of third spacer layer 63 and SiN layer 8 located at the sidewalls of the gate 5, as shown in FIG. 1. This forms the sacrificial amorphous carbon gate structure with LDD and spacer. Shallow trench isolation (STI) 4 in the substrate 1 can be used for isolating P-well from N-well.

In the present invention, the expose portion of the amorphous carbon is sealed to avoid the loss of the amorphous carbon when removing the photoresist in the ashing process before the patterning the LDD photoresist. Two sacrificial spacer layer (the first spacer 61 and the second spacer 62) are involved in the formation of LDD, respectively.

The above is the detailed description of the embodiments of the present invention, but the embodiments only act as examples. The present invention is not limited by the embodiments described. For the technicist in the field, any equivalent modifications and substitutions according to the present invention are also in the scope of the present invention. So any equivalent modifications and substitutions that not separate from the present invention's spirit and range are under the scope of protection of the present invention.

What is claimed is:

1. A method for manufacturing LDD and spacer for a semiconductor device with a sacrificial amorphous carbon gate structure, the method comprising the steps of:

depositing a first spacer layer on a substrate with a gate structure, wherein the first spacer layer covers on the substrate and sidewall and upper surface of the gate structure, and said gate is provided above the N-well and P-well on said substrate, and said gate is an amorphous carbon form material;

spin coating a first photoresist layer on the first spacer layer, where a process of patterning is made to the first photoresist;

selectively removing the portions of first photoresist that cover the N-well, wherein a portion of first photoresist remains on P-well;

forming LDD regions in a top portion of N-well by ion implantation;

removing a redundant first photoresist by an ashing process;

removing the first spacer layer;

sealing the gate to avoid loss of the amorphous carbon form material when removing the redundant first photo-resist in the ashing process;

depositing a second spacer layer on the surface of substrate and gate, wherein the second spacer layer covers the substrate and sidewall and upper surface of the gate structure;

spin coating a second photoresist layer on the second spacer layer, where a process of patterning is made to the second photoresist;

selectively removing the portions of the second photoresist that cover the P-well, wherein a portion of second photoresist remains on N-well;

forming LDD regions in a top portion of P-well by ion implantation;

removing a redundant second photoresist by an ashing process;

removing the second spacer layer;

sealing the gate to avoid loss of the amorphous carbon form material when removing the redundant second photo-resist in the ashing process;

forming a third spacer layer and a SiN layer on the substrate and the gate; and forming a pre-determined spacer structure on sidewalls of the gate by selectively etching the third spacer layer and SiN layer.

2. The method of claim 1, wherein a gate oxide layer is provided between said gate and Si substrate.

3. The method of claim 1, wherein the material of said first spacer layer is selected from the group consisting of: Oxide, silicon oxynitride, or silicon nitride.

4. The method of claim 1, wherein the first spacer layer and the second spacer layer is removed by a wet etch process.

5. The method of claim 1, further comprising the step of selectively etching portions of the third spacer layer and SiN layer to form said spacer structure through a dry etch process.

* * * * *